(12) United States Patent
Rüth et al.

(10) Patent No.: US 8,903,125 B2
(45) Date of Patent: Dec. 2, 2014

(54) METHOD AND DEVICE FOR IDENTIFYING OBJECTS AND FOR TRACKING OBJECTS IN A PRODUCTION PROCESS

(75) Inventors: Edgar Rüth, Kahl am Main (DE); Wolfgang Becker, Schaafheim (DE)

(73) Assignee: Singulus Technologies AG, Kahl am Main (DE)

( * ) Notice: Subject to any disclaimer, the term of this patent is extended or adjusted under 35 U.S.C. 154(b) by 120 days.

(21) Appl. No.: 12/998,830

(22) PCT Filed: Apr. 6, 2010

(86) PCT No.: PCT/EP2010/054503
§ 371 (c)(1),
(2), (4) Date: Jun. 7, 2011

(87) PCT Pub. No.: WO2010/112614
PCT Pub. Date: Oct. 7, 2010

(65) Prior Publication Data
US 2012/0008827 A1    Jan. 12, 2012

(30) Foreign Application Priority Data
Apr. 3, 2009   (DE) .......................... 10 2009 016 289

(51) Int. Cl.
*G06K 9/00*         (2006.01)
*G06T 7/00*         (2006.01)
*H01L 21/67*        (2006.01)

(52) U.S. Cl.
CPC ............ *G06T 7/001* (2013.01); *G06K 9/00577* (2013.01); *H01L 21/67294* (2013.01); *G06T 2207/30148* (2013.01)
USPC ........................................................ 382/103

(58) Field of Classification Search
USPC .............. 382/141–152; 348/86–88, 125–134; 700/95–212; 29/833; 438/16
See application file for complete search history.

(56) References Cited

U.S. PATENT DOCUMENTS

| | | | |
|---|---|---|---|
| 2003/0003608 A1* | 1/2003 | Arikado et al. ................. | 438/14 |
| 2003/0151054 A1* | 8/2003 | Kuznicki et al. ................ | 257/79 |
| 2005/0213458 A1* | 9/2005 | Iwase .......................... | 369/53.35 |
| 2011/0266561 A1* | 11/2011 | Rogers et al. .................. | 257/88 |

FOREIGN PATENT DOCUMENTS

| | | | | |
|---|---|---|---|---|
| EP | 1 844 865 A1 | 10/2007 | ............... | B07C 5/00 |
| EP | 2 068 268 A1 | 6/2009 | ............... | G06K 9/00 |

OTHER PUBLICATIONS

International Search Report for PCT/EP/2010/054503.

\* cited by examiner

*Primary Examiner* — Atiba O Fitzpatrick
(74) *Attorney, Agent, or Firm* — Ohlandt, Greeley, Ruggiero & Perle, L.L.P.

(57) ABSTRACT

An object (1) is identified based on the unique, characteristic, optical properties (10) before the object is processed in a facility (3). In addition, a clear identification is assigned to the object (1). All production data and process parameters for all facilities (3) through which the object (1) passes are stored together with the identification in an electronic data processing means (6). After the object (1) has passed through a facility (3), the object (1) can be identified again based on its unique, characteristic, optical properties (10). Thus, it can be examined whether the system for tracking the object (1) within a production facility (3) functions without errors. Alternatively, the new identification can also be used to assign a new identification to an object (1) for which the unique, characteristic, optical properties (10) have changed during the production process.

13 Claims, 2 Drawing Sheets

METHOD AND DEVICE FOR IDENTIFYING OBJECTS AND FOR TRACKING OBJECTS IN A PRODUCTION PROCESS

This patent application is a US National Phase patent application from PCT Application No. PCT/EP2010/054503 filed Apr. 6, 2010 and claiming priority from German Patent Application No. 10 2009 016 289.5 filed Apr. 3, 2009.

FIELD OF THE INVENTION

The present invention relates to a method and a device for identifying objects, wherein a respective clear identification is assigned to each of the objects. By means of these identifications, the objects can be tracked in a production process and the relevant data of each process step and further process steps can be stored together with the identification.

In a production process, an object goes through many different process steps. In each process step a facility is passed. For allowing an object to be identified, the object is marked. There are many different ways of marking the object (e.g. writing on the object by using a specific pen, making scratches or notches by using a pointed means, etc.). The object is changed by the marking. With a marking, the object can be tracked during the entire production process because it is clearly characterized by the marking. Thus, it is possible to identify the object at different points of the production process. Also individual parameters and/or production data of different process steps thus can be assigned to a marked object. The marking must be firmly connected with the object so that the marking cannot be damaged. The marking must remain on the object during the production process and the legibility of the marking must not deteriorate during a process step.

It is the object of the present invention to provide a method and a device for safely guaranteeing the identification of an object and the assignment of an identification to this object. In addition, a reliable system for tracking the object and collecting its process data during the production process is provided. This object of the invention is achieved by the features of the claims.

SUMMARY OF THE INVENTION

In achieving the object, the invention starts out from the basic idea to identify the object on the basis of its unique, characteristic, optical features or properties, so that a clear identification can be assigned to the object. The object is identified, e.g., by means of a clear structure of its surface. Thus, it is not necessary to additionally apply an identification to the object. The object thus has not to be changed by an additional marking, so that the legibility of the marking cannot be affected either when the object is identified. Thus, it is possible to provide a reliable system for identifying, tracking a product and collecting process data.

By using a means for identifying the object, the object is identified on the basis of its unique, characteristic, optical features. The object can be identified, e.g., on the basis of a recorded image of the object. Identification can be carried out upstream of or in a facility. An electronic data processing means (e.g. a host computer) assigns a clear identification to the object.

During a process step in the facility, the respective location of the object is tracked and the object is managed by a means. Moreover, during the execution of the process step in the facility, the relevant process parameters and/or production data of the object is/are stored in the electronic data processing means together with the clear identification.

After the object has passed a facility, the object can be identified again by means of a further means for identifying the object. Thus, it can be examined whether or not the tracking of the object in the facility functions without errors. Alternatively, a new identification can be assigned to the object in case the unique, characteristic, optical features have changed during a process step.

In the production process, the object can successively pass several facilities. In each facility the object can be identified, tracked and managed and its process parameter and/or production data can be stored under the clear identification of the object. Additionally, after the object has passed a facility, it can be identified again. Thus, it is examined whether the tracking of the object in the respective facility functions without errors. The object can be stored intermediately between the individual facilities.

The method and the device according to the invention for identifying objects having unique, characteristic, optical features are particularly suitable for wafers. In particular, the wafer can be a PV waver (PV=photovoltaic) on a polycrystalline silicon basis.

BRIEF DESCRIPTION OF THE DRAWINGS

In the following, the invention will be described in more detail on the basis of the Figures in which.

DETAILED DESCRIPTION OF THE INVENTION

Figure 1:
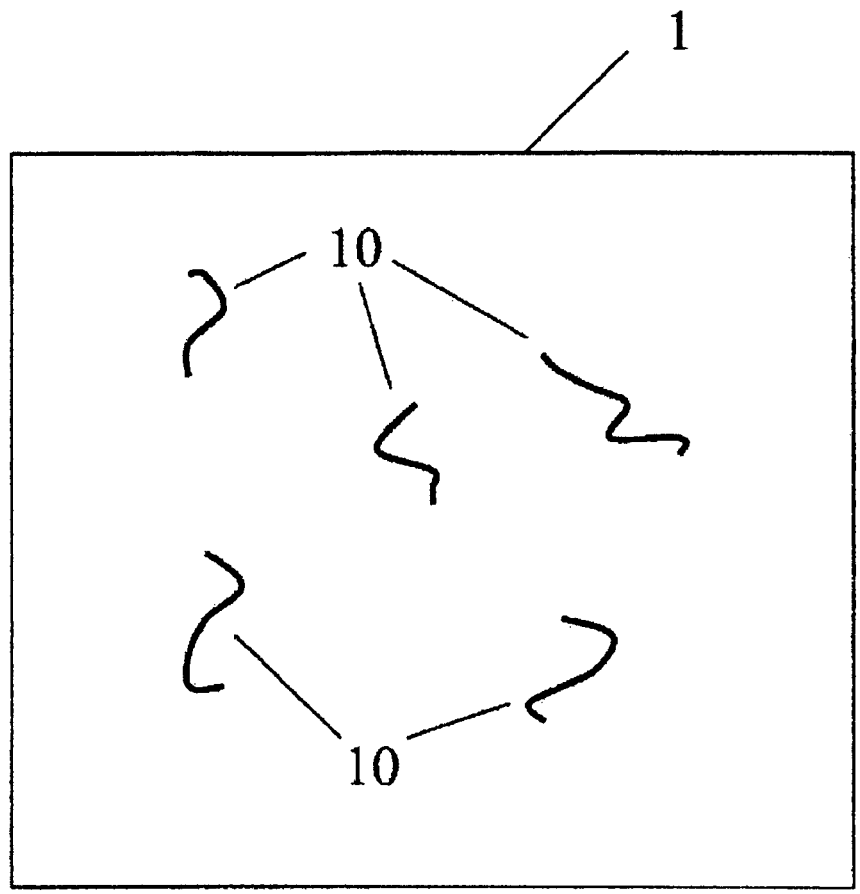
FIG. 1 shows a schematic view of the surface of a wafer.

FIG. 1 shows an object 1 whose surface has unique, characteristic, optical features 10. In general, all unique, characteristic, optical features 10 of an objects 1 can be used for clearly identifying the object. This object 1 is, e.g., a wafer 1, in particular a square wafer 1 having a side length of, e.g., 100 to 160 mm and a thickness of about 0.05 to 0.25 mm. The wafer 1 shown in FIG. 1 is made on the basis of polycrystalline silicon. These wafers 1 are suitable in particular for photovoltaics (PV). Wafers 1 of this kind are also referred to as PV wafers 1. The structure of the surface is unique to each wafer 1, similar to the fingerprint of a human.

Figure 2:
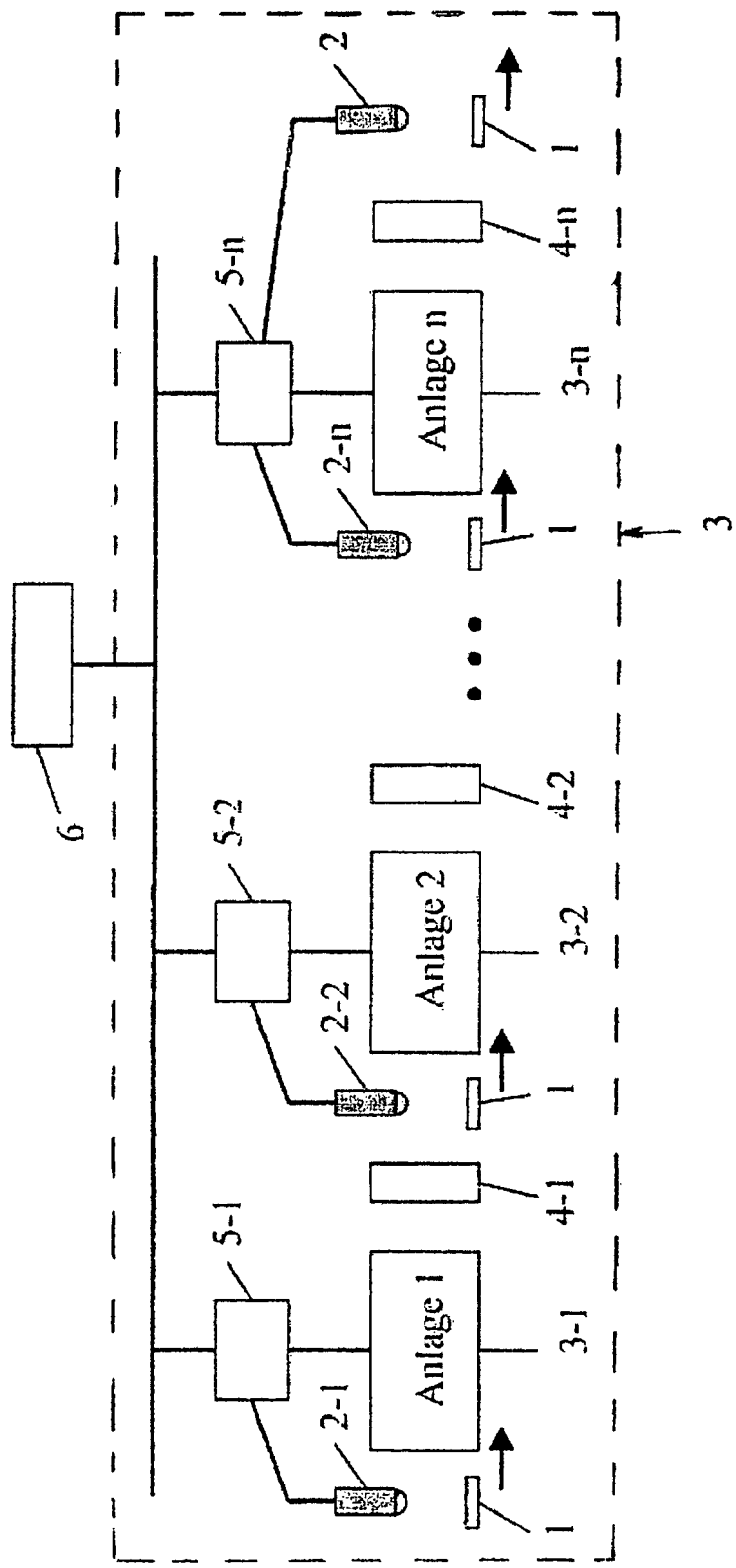
FIG. 2 shows a schematic view of a device for identifying and tracking an object (wafer) with unique, characteristic, optical features.

In the following, an embodiment of the present invention will be described on the basis of such a wafer 1. FIG. 2 shows a device for identifying and tracking a wafer 1, said device comprising a plurality of facilities or processing stations 3-1, 3-2, . . . 3-n, a plurality of means 2-1, 2-2, . . . 2-n and 2 for identifying the wafer 1, a plurality of storage means 4-1 and 4-2 for storing the wafer between the facilities 3-1, 3-2, . . . 3-n, an end storage means 4-n, a plurality of data processing means 5-1, 5-2, . . . 5-n belonging to the respective facility, and a central data processing means 6.

The structure of the wafer 1 with the unique, characteristic, optical features 10 is detected by a means 2-1 for identifying the wafer 1 before the first production step, i.e. upstream of or in the first facility 3-1. In particular, this means 2-1 for identifying the wafer 1 can be a camera which takes a picture of the surface of the wafer 1. The picture, i.e. the electronic data of the picture, is/are transmitted to the data processing means 5-1 of the first facility 3-1. Via the data processing means 5-1 of the first facility 3-1, the data reach the central data processing means 6. The data processing means 6 can be realized as host computer 6. The host computer 6 assigns to the unique structure of the surface of the wafer 1 a clear identification (marking) and stores this identification in a database. Such a clear identification can be, e.g., a clear number. Subsequently, the wafer 1 is processed in the first facility 3-1. The processing of the wafer 1 in the first facility 3-1 represents the first process step in the production process. The process parameters and the production data of the wafer 1 for the first facility 3-1, which have to be stored during the first process step, are transmitted by the data processing means 5-1 of the first facility 3-1 to the host computer 6. In the host computer 6, the process parameters and the production data of the wafer 1 are stored under the clear number assigned to the wafer.

At the end of the first facility 3-1 it is possible to examine the means for tracking and managing the object 1 inside the facility 3-1. To this end, a further camera 2-2 at the end of the first facility 3-1 takes a picture of the structure of the surface of the wafer 1. This picture is compared with the data stored in the host computer 6. It thus can be guaranteed that the means for tracking and managing the object 1 functions without errors in the overall facility 3.

Alternatively, a renewed identification of a wafer 1 downstream of a facility 3-1, 3-2, . . . 3-n can also be used for assigning updated unique, characteristic, optical features to the wafer 1. This can be necessary if the surface structure of the waver changes in a facility 3-1, 3-2, . . . 3-n. Such a change can appear, e.g., in a coating process. In this case, the changed (updated) unique, optical features are assigned to the identification which was assigned to the object because of the original or former unique, optical features, in order to be able to identify the object in the following. In the following processing stations, the process parameters and/or production data to be newly stored are correlated with the updated unique features and thus again assigned to the corresponding identification of the object.

After having passed a facility, e.g. facility 3-1, the wafer 1 can be transferred directly to the subsequent facility 3-2 (e.g. a processing station). Transfer can take place either directly in a fully automatic manner or also manually. In addition, it is possible to store (buffer) the wafer 1 in a storage means 4-1 between two facilities 3-1 and 3-2. In principle, as many facilities as desired can be used in the method of the invention and the device of the invention. In the host computer 6, the process parameters and/or production data of the wafer 1 are supplemented in the database for each further facility 3-1, 3-2, . . . 3-n under the clear identification of the object. Thus, all relevant data are assigned to the wafer 1 during the process step in the respective facility 3-1, 3-2, . . . 3-n, so that at the end the entire production history is depicted. By means of the camera 2, which is arranged either upstream or downstream of the last storage unit 4-n, the processed object 1 is then identified and thus examined for the correct assignment.

According to the invention, the wafer 1 is identified on the basis of its surface structure by means of a camera 2-1, 2-2, . . . 2-n, 2, and an identification (e.g. a number) is assigned to this structure. A combination of monitoring the wafer 1 using a camera and tracking the wafer 1 in a facility (comprising means for tracking and managing the wafer 1) provides a reliable system for identifying and collecting process data.

The invention claimed is:

1. A method for identifying a wafer, comprising:
   (a) detecting a unique structure of a surface of said wafer, without the necessity of applying additional marking identification to the wafer, wherein said unique structure comprises characteristic and/or optical features,
   (b) storing the detected features as identification of the wafer, and
   (c) processing the wafer as a process step in one or more processing facilities of a production process.

2. The method according to claim 1, wherein the optical surface structure is detected by a camera as a picture.

3. A method for tracking a wafer in the production process comprising one or more process steps by:
   (a) using the identification according to claim 1 and
   (b) additionally assigning and storing process parameters and/or production data for the wafer as process step data relating to the stored identification of the wafer.

4. The method according to claim 3, wherein in case the unique, characteristic, optical features change during a process step, the changed, unique, characteristic, optical features form the current identification of the wafer after the process step.

5. The method according to claim 3, wherein by means of a renewed identification of the wafer on the basis of unique, characteristic, optical features of the wafer it is examined after passing a facility whether the tracking in a facility during a process step functions without errors.

6. The method according to claim 3, wherein the wafer can be stored intermediately between the individual process steps.

7. The method according to claim 3, wherein the production data and the process parameters are stored in an electronic data processing means in a manner assigned to the respective identification.

8. The method according to claim 1, wherein the wafer is a photovoltaic wafer on a polycrystalline silicon basis.

9. A device for identifying a wafer according to claim 1, comprising: a camera for detecting and identifying the wafer on the basis of unique, characteristic, optical features of the surface of the wafer upstream of or in a processing facility without the necessity of applying additional marking identification to the wafer; an electronic data processing means for storing the unique, characteristic, optical features of the surface of the wafer in digital form and for assigning an identification to the wafer; and means for tracking and managing the wafer in the processing facility.

10. The method according to claim 3, wherein the wafer is a photovoltaic wafer on a polycrystalline silicon basis.

11. The method of claim 1, wherein the detecting of the unique, characteristic, optical features of the surface of the wafer without the necessity of applying additional marking identification to the wafer occurs before the process step in said one or more processing facilities of said production process.

12. The method according to claim 3, wherein the wafer is a photovoltaic wafer on a polycrystalline silicon basis.

13. The method according to claim 1, further comprising assigning said identification to said wafer based upon said unique structure.

* * * * *